United States Patent [19]

Harwood et al.

[11] Patent Number: 5,604,444

[45] Date of Patent: *Feb. 18, 1997

[54] WAFER PROBE STATION HAVING ENVIRONMENT CONTROL ENCLOSURE

[75] Inventors: Warren K. Harwood; Paul A. Tervo, both of Vancouver, Wash.; Martin J. Koxxy, Hillsboro, Oreg.

[73] Assignee: Cascade Microtech, Inc., Beaverton, Oreg.

[*] Notice: The term of this patent shall not extend beyond the expiration date of Pat. No. 5,266,889.

[21] Appl. No.: 641,029

[22] Filed: Apr. 29, 1996

Related U.S. Application Data

[60] Continuation of Ser. No. 417,982, Apr. 6, 1995, Pat. No. 5,532,609, which is a division of Ser. No. 245,581, May 18, 1994, Pat. No. 5,434,512, which is a division of Ser. No. 896,853, Jun. 11, 1992, Pat. No. 5,345,170.

[51] Int. Cl.$^6$ .......................... G01R 31/02; G01R 1/073
[52] U.S. Cl. .......................... 324/754; 324/158.1; 324/761
[58] Field of Search .................. 324/754, 758, 324/759, 760, 761, 72.5, 73.1, 158.1

[56] References Cited

U.S. PATENT DOCUMENTS

| | | | |
|---|---|---|---|
| 3,185,927 | 5/1965 | Margulis et al. | 324/759 |
| 3,333,274 | 7/1967 | Forcier | 324/754 |
| 3,405,361 | 10/1968 | Kattner et al. | 324/759 |
| 3,710,251 | 1/1973 | Hagge et al. | 324/760 |
| 4,115,736 | 9/1978 | Tracy | 324/760 |
| 4,383,178 | 5/1983 | Shibata et al. | 250/492.2 |
| 4,694,245 | 9/1987 | Frommes | 324/754 |
| 4,757,255 | 7/1988 | Margozzi | 324/760 |
| 4,758,785 | 7/1988 | Rath | 324/754 |
| 4,771,234 | 9/1988 | Cook et al. | 324/754 |
| 4,845,426 | 7/1989 | Nolan et al. | 324/760 |
| 4,856,904 | 8/1989 | Akagawa | 324/158.1 |
| 5,077,523 | 12/1991 | Blanz | 324/760 |
| 5,084,671 | 1/1992 | Miyata et al. | 324/760 |
| 5,220,277 | 6/1993 | Reitinger | 324/754 |
| 5,266,889 | 11/1993 | Harwood et al. | 324/760 |
| 5,345,170 | 9/1994 | Schwindt et al. | 324/754 |

FOREIGN PATENT DOCUMENTS

| | | |
|---|---|---|
| 201205 | 12/1986 | European Pat. Off. . |
| 3114466 | 3/1982 | Germany . |
| 2-022837 | 1/1990 | Japan . |
| 2-220453 | 9/1990 | Japan . |
| 4-000732 | 1/1992 | Japan . |

OTHER PUBLICATIONS

Micromanipulator Company, Inc., "Test Station Accessories," 1983. (Month unavailable).

Temptronic Corporation, "Application Note 1–Controlled Environment Enclosure for Low Temperature Wafer Probing in a Moisture–Free Environment," (1990) (Month unavailable).

Temptronic Corporation, "Model TPO3000 Series Thermo Chuck Systems," (1990) (Month available).

Y. Yamamoto, "A Compact Self–Shielding Prober for Accurate Measurement of On–Wafer Electron Devices," *IEEE Trans., Instrumentation and Measurement*, vol. 38, pp. 1088–1093, 1989. (Month unavailable).

(List continued on next page.)

*Primary Examiner*—Ernest F. Karlsen
*Attorney, Agent, or Firm*—Chernoff, Vilhauer, McClung & Stenzel

[57] ABSTRACT

A wafer probe station is equipped with an integrated environment control enclosure substantially surrounding a supporting surface for holding a test device, such enclosure limiting fluid communication between the interior and exterior of the enclosure and preferably also providing EMI shielding and a dark environment. The limited communication between the interior and exterior of the enclosure is kept substantially constant despite positioning movement of either the supporting surface or probe holders. The positioning mechanisms for the supporting surface and probe holders each have portions located at least partially outside of the enclosure for transferring movement mechanically to the surface or holders, respectively.

9 Claims, 7 Drawing Sheets

OTHER PUBLICATIONS

Signatone Model S-1240 Cross Section (1987) (Month unavailable).

Signatone Model S-1240 Promotional Brochure (1987) (Month unavailable).

Micromanipulator Company, Inc., "Model 8000 Test Station," 1986. (Month unavailable).

Micromanipulator Company, Inc., "Model 8000 Test Station," 1988. (Month unavailable).

S. Beck and E. Tomann, "Chip Tester," IBM Technical Disclosure Bulletin, Jan. 1985, p. 4819.

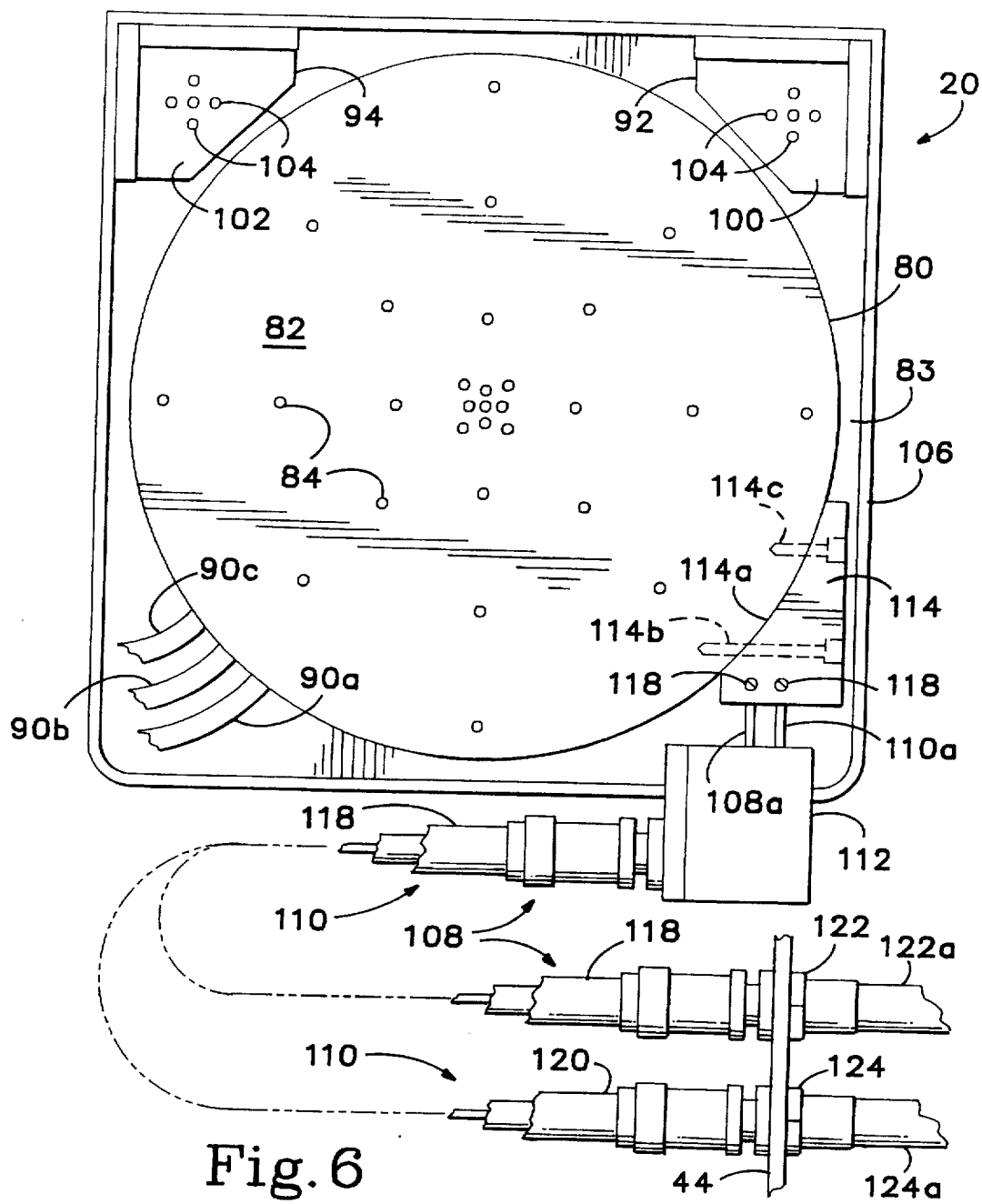
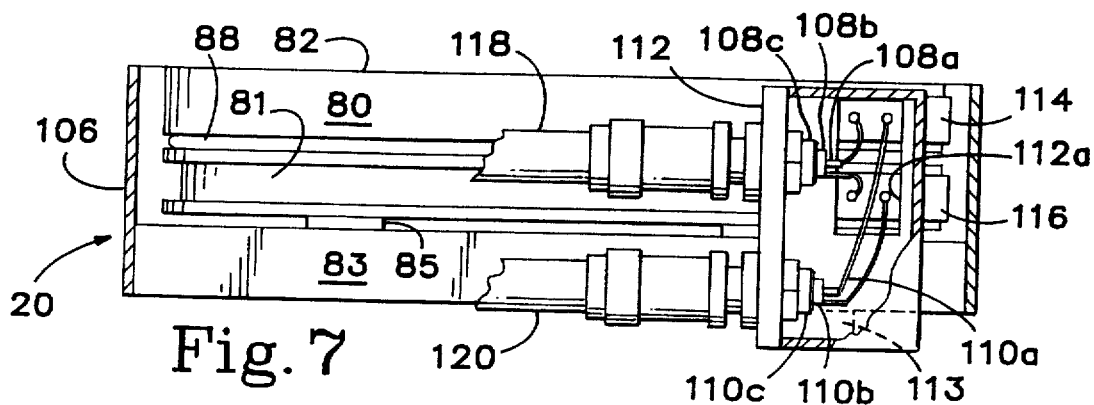
Fig. 6
Fig. 7

WAFER PROBE STATION HAVING ENVIRONMENT CONTROL ENCLOSURE

This application is a continuation of U.S. patent application Ser. No. 08/417,982, filed Apr. 6 1995, now U.S. Pat. No. 5,532,609, which in turn is a divisional of U.S. patent application Ser. No. 08/245,581, filed May 18, 1994, now U.S. Pat. No. 5,434,512, which in turn is a divisional of U.S. patent application Ser. No. 07/896,853 filed Jun. 11, 1992, now U.S. Pat. No. 5,345,170.

BACKGROUND OF THE INVENTION

The present invention is directed to probe stations for making highly accurate measurements of high-speed, large scale integrated circuits at the wafer level, and of other electronic devices. More particularly, the invention relates to such a probe station having an environment control enclosure for limiting the communication of the wafer-supporting chuck and probes with outside influences such as electromagnetic interference (EMI), air, and/or light.

SUMMARY OF THE INVENTION

The probe station is equipped with an integrated environment control enclosure substantially surrounding a supporting surface for holding a test device, such enclosure limiting fluid communication between the interior and exterior of the enclosure and preferably also providing EMI shielding and a dark environment. The limited communication between the interior and exterior of the enclosure is kept substantially constant despite positioning movement of either the supporting surface or probe holders. The positioning mechanisms for the supporting surface and probe holders each have portions located at least partially outside of the enclosure for transferring movement mechanically to the surface or holder.

According to another aspect of the invention, the environment control enclosure has an upper portion extending above the supporting surface and a side portion substantially surrounding the supporting surface, the supporting surface being movable laterally with respect to the top of the side portion.

According to another aspect of the invention, the environment control enclosure has an opening with a closable door for substituting different test devices on the supporting surface in a manner compatible with the positioning and environment control functions.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2A is a partial top view of the wafer probe station of FIG. 1 with the enclosure door shown partially open.

FIG. 3A is an enlarged sectional view taken along line 3A—3A of FIG. 3.

FIG. 6 is a partially schematic top detail view of the chuck assembly, taken along line 6—6 of FIG. 3.

FIG. 7 is a partially sectional front view of the chuck assembly of FIG. 6.

DESCRIPTION OF THE PREFERRED EMBODIMENT

General Arrangement of Probe Station

Figure 1:
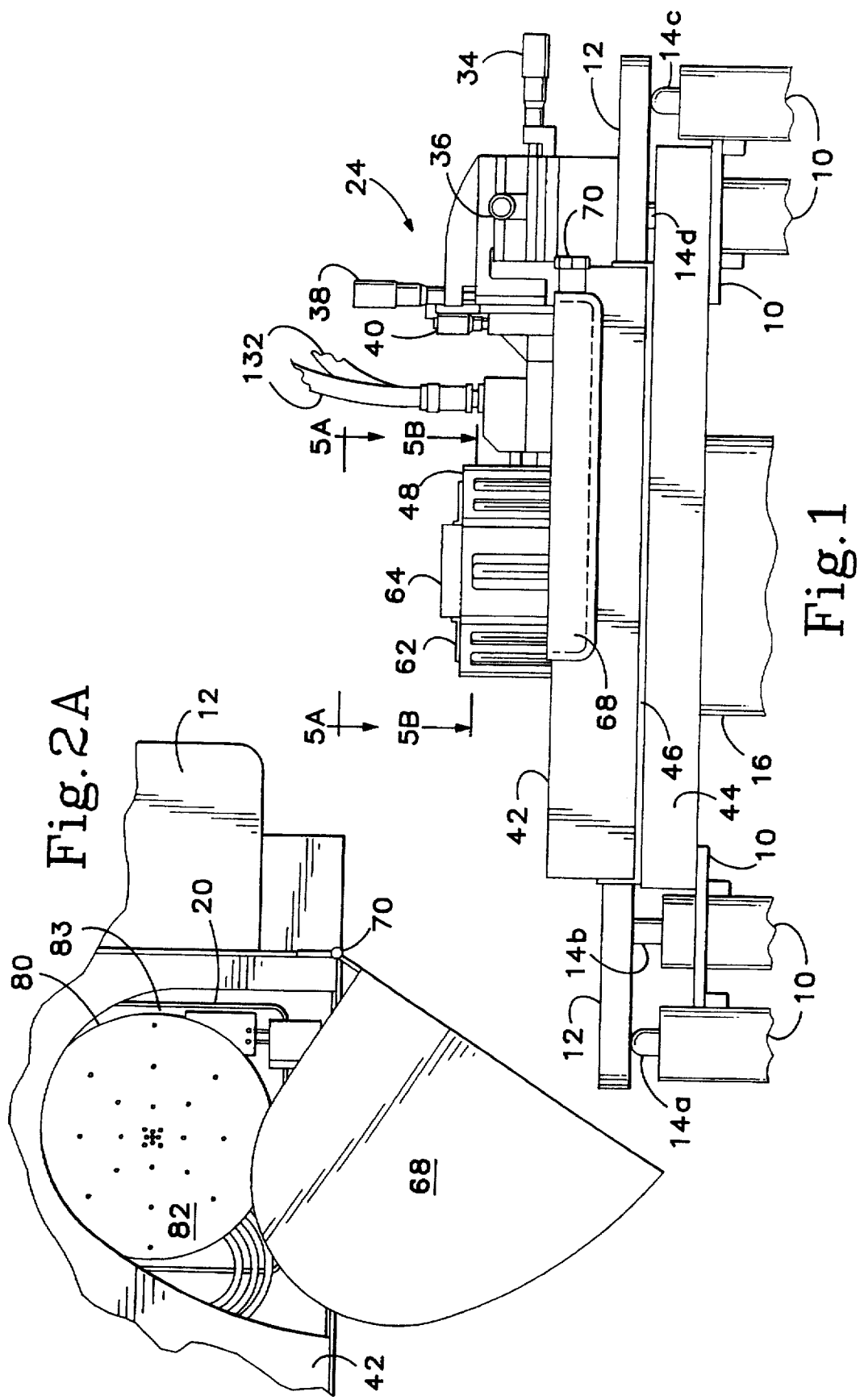
FIG. 1 is a partial front view of an exemplary embodiment of a wafer probe station constructed in accordance with the present invention.
Figure 2:
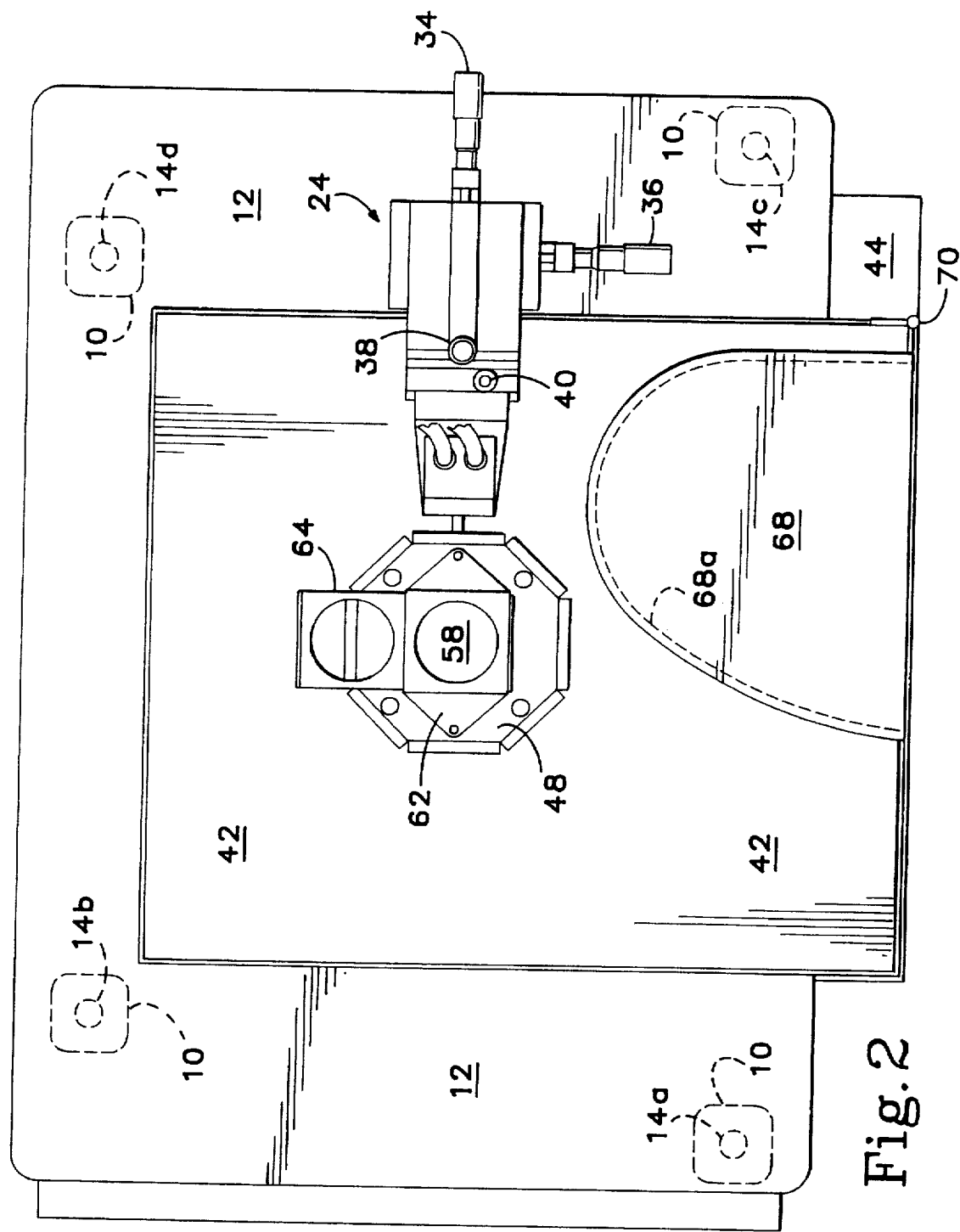
FIG. 2 is a top view of the wafer probe station of FIG. 1.
Figure 3:
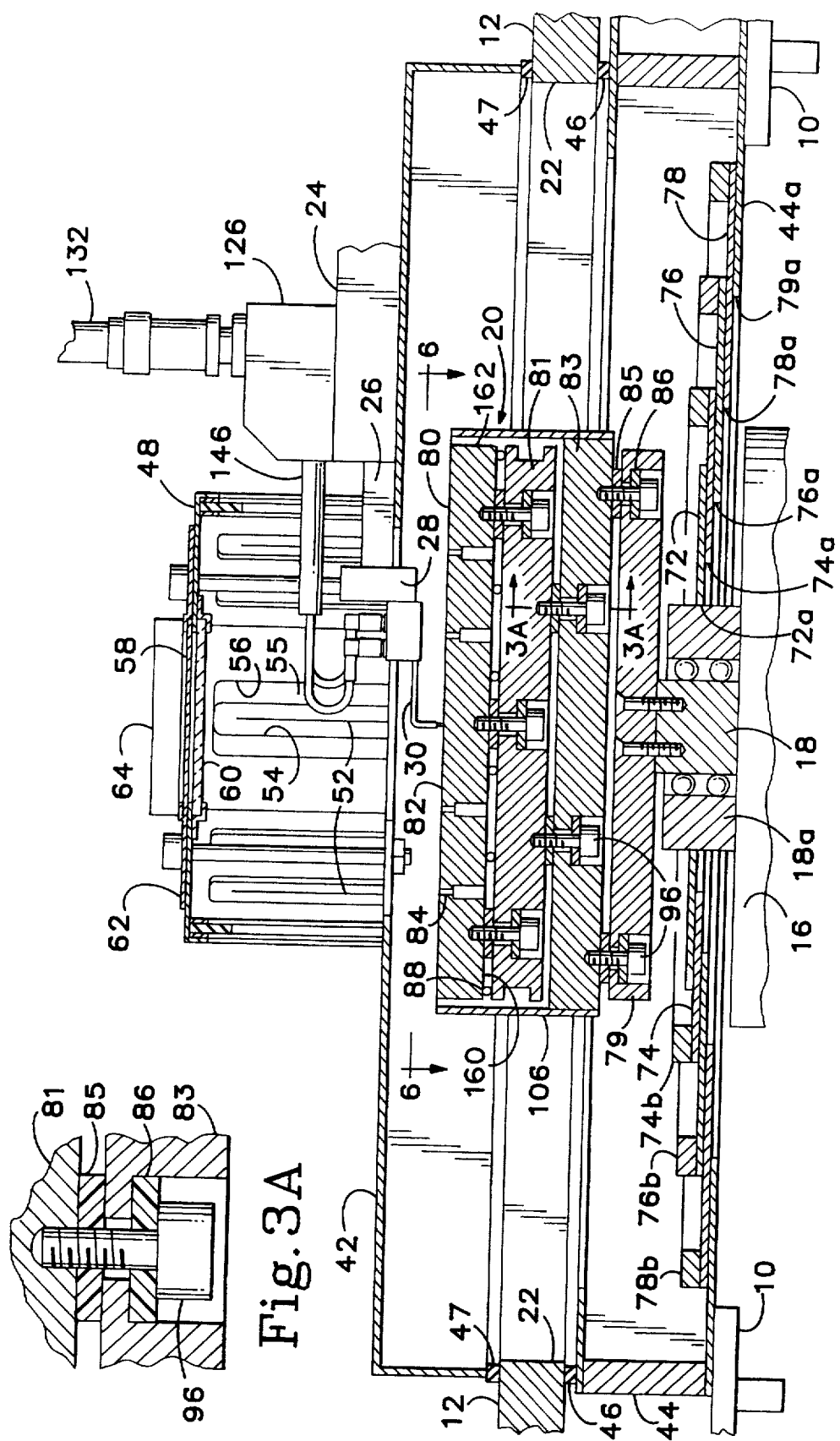
FIG. 3 is a partially sectional and partially schematic front view of the probe station of FIG. 1.

With reference to FIGS. 1, 2 and 3, an exemplary embodiment of the probe station of the present invention comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
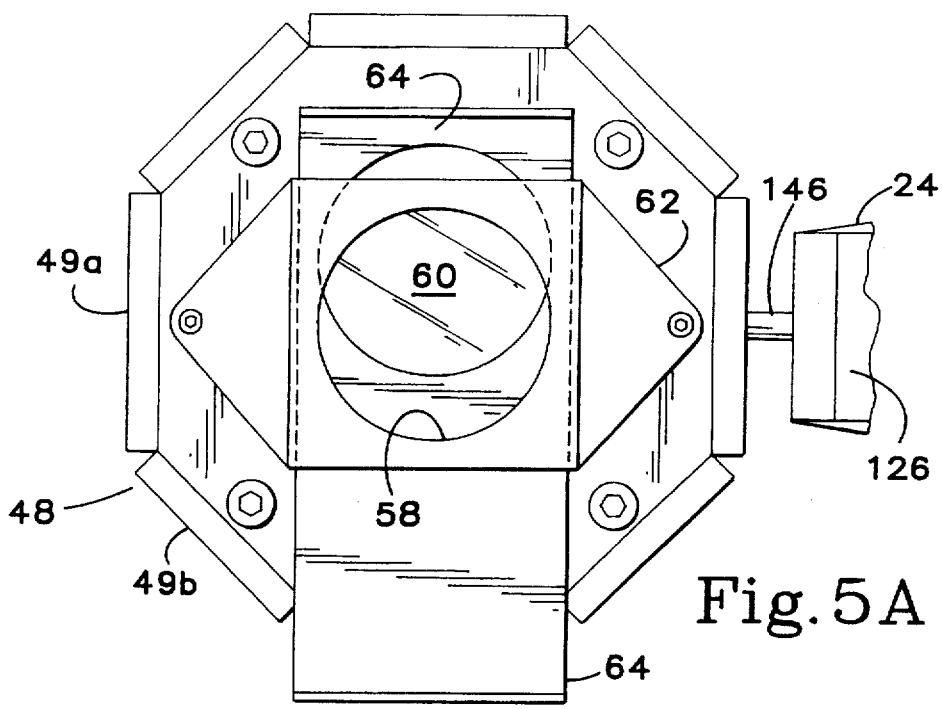
FIG. 5A is an enlarged top detail view taken along line 5A—5A of FIG. 1.
Figure 5B:
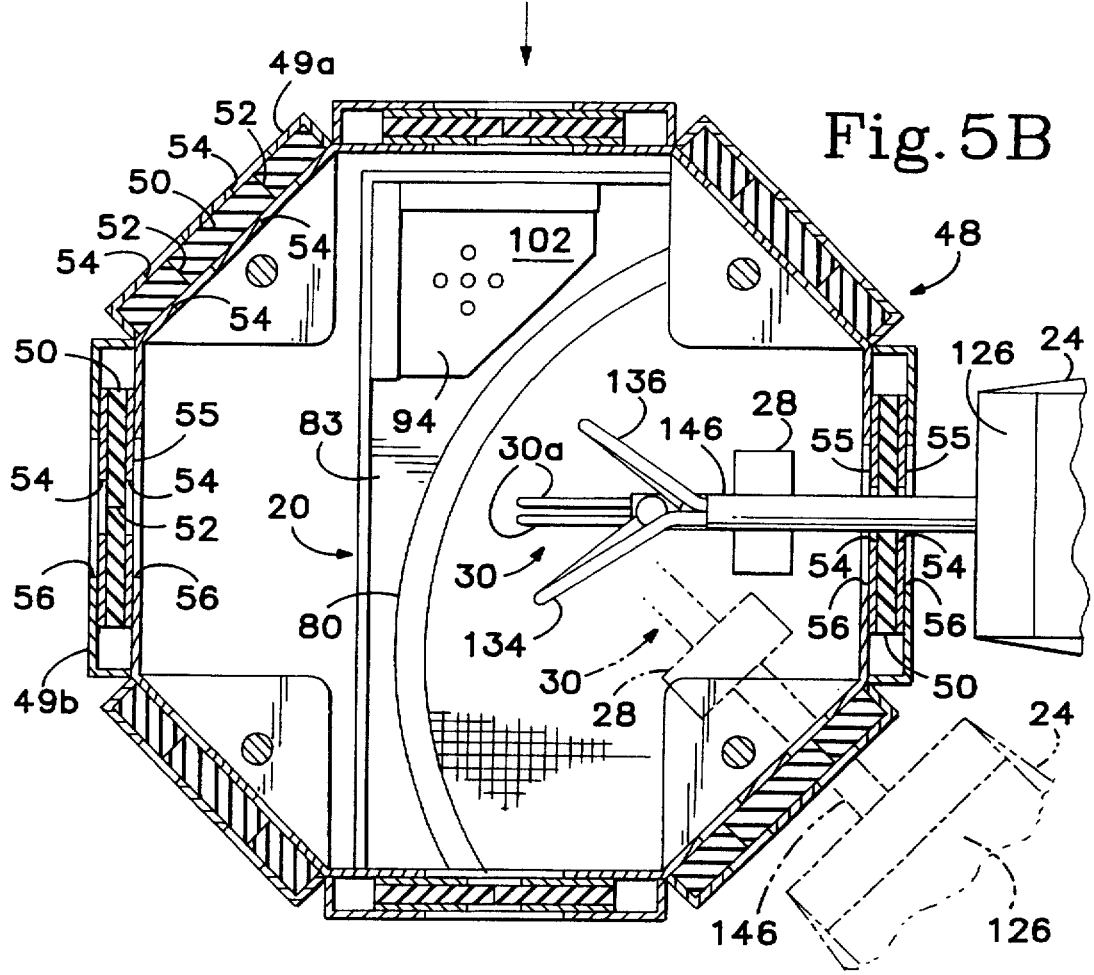
FIG. 5B is an enlarged top sectional view taken along line 5B—5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
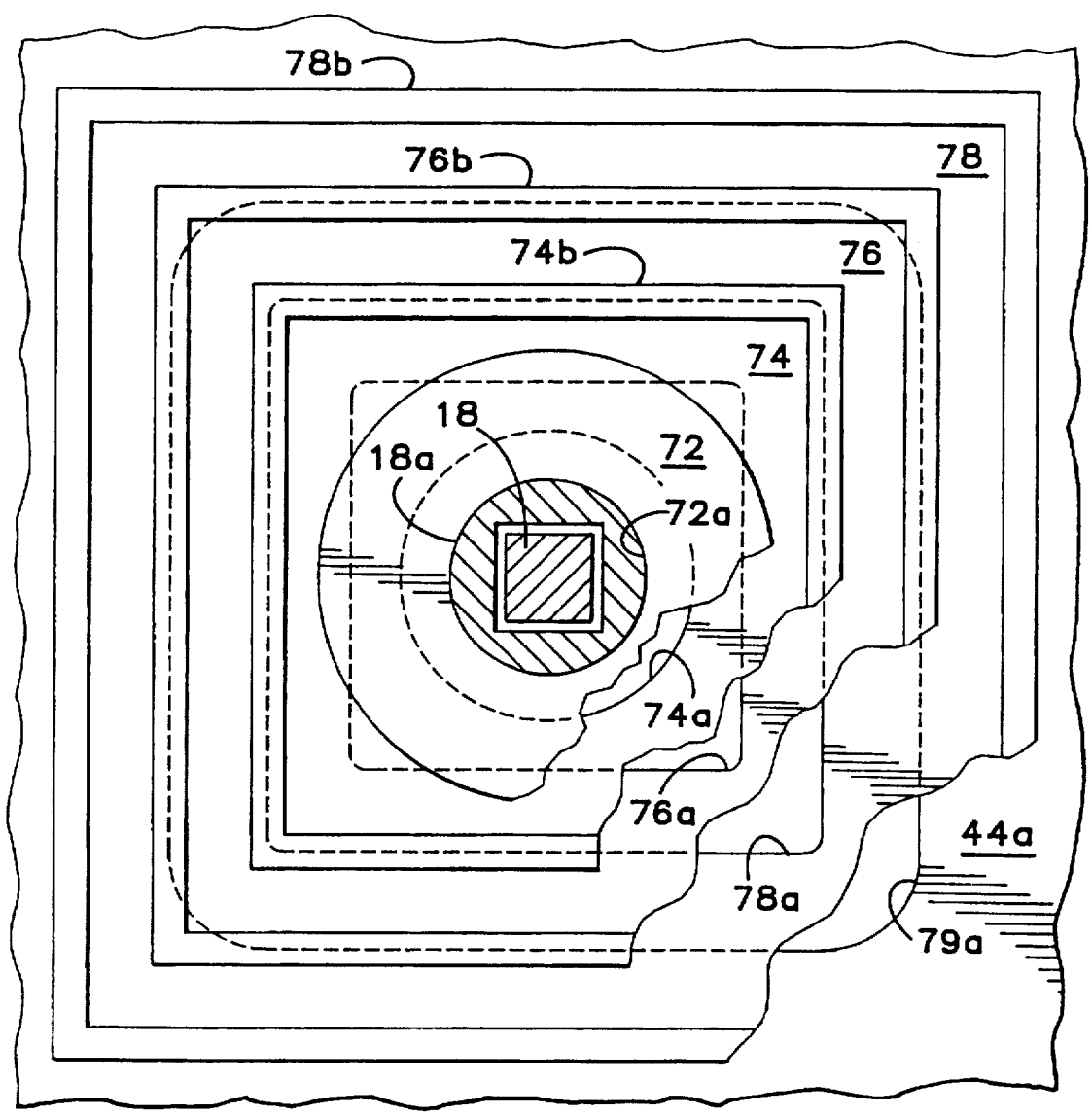
FIG. 4 is a top view of the sealing assembly where the motorized positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Chuck Assembly

With particular reference to FIGS. 3, 6 and 7, the chuck assembly 20 is of a unique modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E.I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b.

In any case, the detachable connector assemblies 108, 110, due to their interconnections with the two connector plates 114, 116, provide immediately ready-to-use signal and guard connections to the chuck assembly elements 80 and 81, respectively, as well as ready-to-use guarded Kelvin connections thereto. For applications requiring only guarding of the chuck assembly, as for example the measurement of low-current leakage from a test device through the element 80, it is necessary only that the operator connect a single guarded cable 122a from a test instrument such as a Hewlett-Packard 4142B modular DC source/monitor to the detachable connector 122 so that a signal line is provided to the chuck assembly element 80 through the connector element 108a and connector plate 114, and a guard line is provided to the element 81 through the connector element 108b and connector plate 116. Alternatively, if a Kelvin connection to the chuck assembly is desired for lowvoltage measurements, such as those needed for measurements of low capacitance, the operator need merely attach a pair of cables 122a and 124a to the respective connectors 122, 124 from a suitable test instrument such as a Hewlet-Packard 4284A precision LCR meter, thereby providing both source and measurement lines to the element 80 through the connector elements 108a and 110a and connector plate 114, and guarding lines to the element 81 through the connector elements 108b and 110b and connector plate 116.

Probe Assembly

Figure 8:
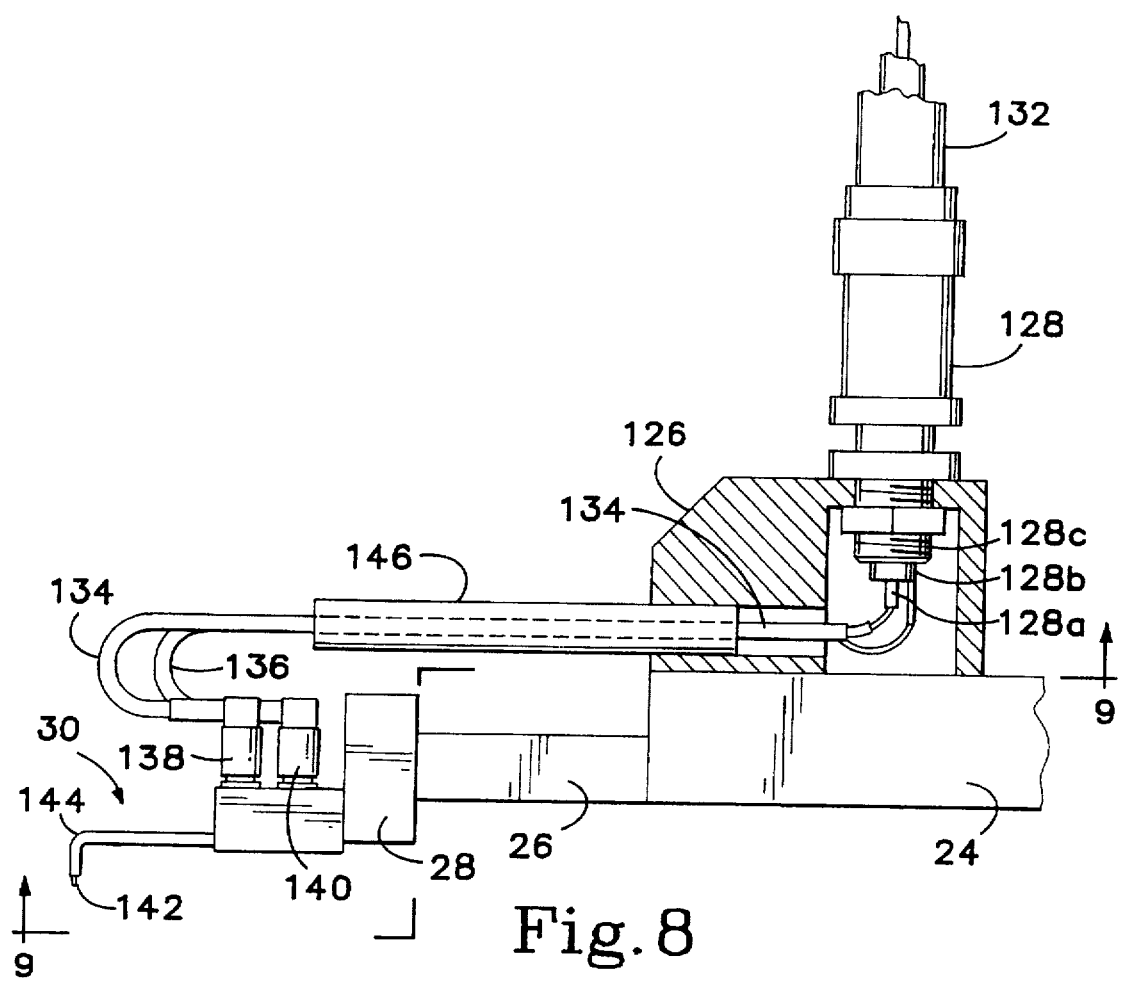
FIG. 8 is a partially sectional side view of a probe holder and probe.
Figure 9:
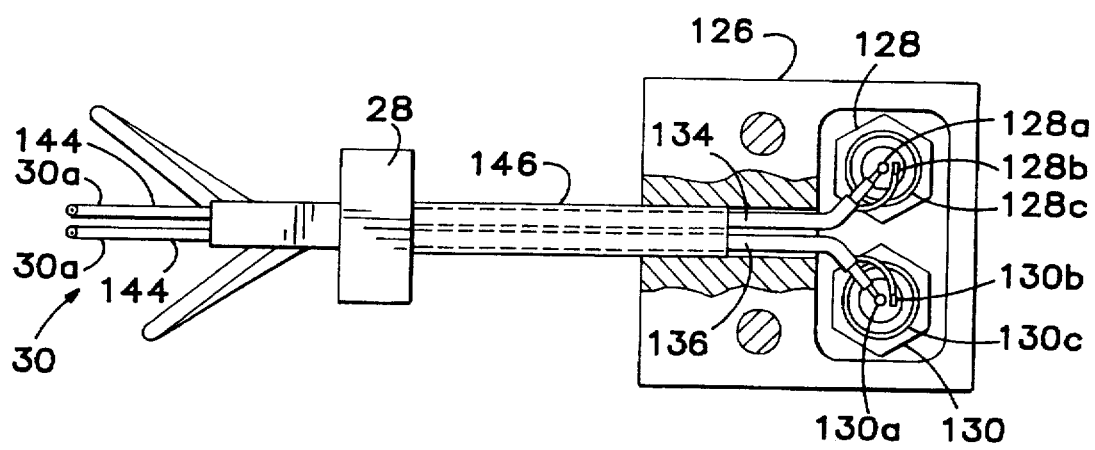
FIG. 9 is a partially sectional bottom view taken along line 9—9 of FIG. 8.

With reference to FIGS. 5B, 8 and 9, respective individually movable probes 30 comprising pairs of probe elements 30a are supported by respective probe holders 28 which in turn are supported by respective extending portions 26 of different probe positioners such as 24. Atop each probe positioner 24 is a shield box 126 having a pair of triaxial connectors 128, 130 mounted thereon with respective triaxial cables 132 entering each triaxial connector from a suitable test instrument as mentioned previously. Each triaxial connector includes a respective inner connector element 128a, 130a, an intermediate connector element 128b, 130b, and an outer connector element 128c, 130c in concentric arrangement. Each outer connector element 128c, 130c terminates by connection with the shield box 126. Conversely, the inner connector elements 128a, 130a, and the intermediate connector elements 128b, 130b, are connected respectively to the inner and outer conductors of a pair of coaxial cables 134, 136 which therefore are guarded cables. Each cable 134, 136 terminates through a respective coaxial connector 138, 140 with a respective probe element 30a having a center conductor 142 surrounded by a guard 144. In order to provide adequate shielding for the coaxial cables 134, 136, especially in the region outside of the octagonal box 48, an electrically-conductive shield tube 146 is provided around the cables 134, 136 and electrically connected through the shield box 126 with the outer connector element 128c, 130c of the respective triaxial connectors 128, 130. The shield tube 146 passes through the same slit in the foam 50 as does the underlying extending member 26 of the probe positioner 24. Thus, each individually movable probe 30 has not only its own separate individually movable probe holder 28 but also its own individually movable shield 146 for its guarded coaxial cables, which shield is movable in unison with the probe holder independently of the movement of any other probe holder by any other positioning mechanism 24. This feature is particularly advantageous because such individually movable probes are normally not equipped for both shielded and guarded connections, which deficiency is solved by the described structure. Accordingly, the probes 30 are capable of being used with the same guarding and Kelvin connection techniques in a ready-to-use manner as is the chuck assembly 20, consistently with full shielding despite the individual positioning capability of each probe 30.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station comprising:

(a) a surface extending in a lateral direction for holding a test device on said surface;

(b) a holder for an electrical probe for contacting said test device;

(c) a pair of positioning mechanisms each for selectively moving a corresponding one of said surface and said holder, independently of each other, toward or away from the other along an axis of approach; and (d) an environment control enclosure substantially surrounding said surface for limiting fluid communication between the interior and exterior of said enclosure to a substantially constant degree despite movement by said positioning mechanisms of either one of said surface and holder, respectively, toward or away from the other along said axis of approach, said enclosure having an upper portion extending over said surface substantially in said lateral direction and a side portion, substantially surrounding said surface laterally, having a top adjacent to said upper portion and extending generally toward said upper portion, said surface being movable by one of said positioning mechanisms in said lateral direction with respect to said top of said side portion, said pair of positioning mechanisms each having a portion located at least partially outside of said enclosure for transferring movement mechanically to the corresponding one of said surface and said holder.

2. A probe station comprising:

(a) a surface extending in a lateral direction for holding a test device on said surface;

(b) at least two holders for respective electrical probes for contacting said test device;

(c) respective positioning mechanisms each for selectively moving a corresponding one of said surface and said holders, independently of each other, in relation to each other in said lateral direction;

(d) an environment control enclosure substantially surrounding said surface for limiting fluid communication between the interior and exterior of said enclosure to a substantially constant degree despite movement by said positioning mechanisms of said surface and holders in said lateral direction, each of said positioning mechanisms having a portion located at least partially outside of said enclosure for transferring movement mechanically to the corresponding one of said surface and said holders; and (e) said enclosure having an opening for providing access to said surface, for substituting different test devices on said surface, and a door for selectively closing said opening, said portion of each positioning mechanism being capable of mechanically transferring movement to the corresponding one of said surface and said holders while said door is closed.

3. A probe station comprising:

(a) a surface extending in a lateral direction for holding a test device on said surface;

(b) a holder for an electrical probe for contacting said test device;

(c) a pair of positioning mechanisms each for selectively moving a corresponding one of said surface and said holder independently of each other, in relation to each other;

(d) an environment control enclosure, said enclosure having an upper portion extending over said surface substantially in said lateral direction and a side portion, substantially surrounding said surface laterally, having a top adjacent to said upper portion and extending generally toward said upper portion, said surface being movable by one of said positioning mechanisms in said lateral direction with respect to said top of said side portion, said pair of positioning mechanisms each having a portion located at least partially outside of said enclosure for transferring movement mechanically to the corresponding one of said surface and said holder.

4. A probe station comprising:

(a) a surface extending in a lateral direction for holding a test device on said surface;

(b) at least two holders for respective electrical probes for contacting said test device;

(c) respective positioning mechanisms each for selectively moving a corresponding one of said surface and said holders, independently of each other, in relation to each other in said lateral direction;

(d) an environment control enclosure substantially surrounding said surface, each of said positioning mechanisms having a portion located at least partially out side of said enclosure for transferring movement mechanically to the corresponding one of said surface and said holders; and (e) said enclosure having an opening for providing access to said surface, for substituting different test devices on said surface, and a door for selectively closing said opening, said portion of each positioning mechanism being capable of mechanically transferring movement to the corresponding one of said surface and said holders while said door is closed.

5. The probe station of any one of claims 1–4, said enclosure substantially shielding said surface against electromagnetic interference.

6. The probe station of any one of claims 1–4, said enclosure substantially shielding said surface against light.

7. The probe station of any one of claims 1 and 3, said enclosure having an opening for providing access to said surface, for substituting different test devices on said surface, and a door for selectively closing said opening, said portion of each positioning mechanism being capable of mechanically transferring movement to the corresponding one of said surface and said holder while said door is closed.

8. The probe station of any one of claims 2 and 4, including a further positioning mechanism, each holder being supported by said upper portion of said enclosure and said upper portion being movable by said further positioning mechanism so as to move said holders in unison.

9. The probe station of any one of claims 2 and 4, said upper portion of said enclosure defining at least a pair of openings each for separately receiving the insertion of a respective mechanical member into said enclosure from a respective positioning mechanism of a respective holder.

* * * * *